United States Patent [19]

Quan

[11] Patent Number: 4,516,041
[45] Date of Patent: May 7, 1985

[54] VOLTAGE CONTROLLED VARIABLE CAPACITOR

[75] Inventor: Ronald Quan, Cupertino, Calif.

[73] Assignee: Sony Corporation, Tokyo, Japan

[21] Appl. No.: 443,250

[22] Filed: Nov. 22, 1982

[51] Int. Cl.³ .................... H03K 5/00; G06G 7/18
[52] U.S. Cl. .................... 307/494; 307/490;
 307/498; 307/590; 307/320; 307/262; 307/510;
 307/514; 307/597; 330/282; 328/127; 334/15;
 357/14
[58] Field of Search .......... 307/490, 494, 498, 320,
 307/590, 592, 597, 603, 606, 262, 510, 514;
 357/14; 328/127, 155; 334/15; 330/282, 107;
 361/277

[56] References Cited

U.S. PATENT DOCUMENTS

| | | | |
|---|---|---|---|
| 3,944,945 | 3/1976 | Corte et al. | 331/78 |
| 4,191,899 | 3/1980 | Tomczak | 307/303 |
| 4,223,271 | 9/1980 | Furukawa | 328/127 |
| 4,396,890 | 8/1983 | Kato et al. | 330/86 |

FOREIGN PATENT DOCUMENTS

H04B1/16  7/1982  PCT Int'l Appl. ............. 455/233

Primary Examiner—Stanley D. Miller
Assistant Examiner—Richard Roseen
Attorney, Agent, or Firm—Philip M. Shaw, Jr.

[57] ABSTRACT

A voltage controlled capacitor is created by connecting a capacitance between the output of an amplifier whose gain is voltage controllable and an inverting input of the amplifier.

6 Claims, 1 Drawing Figure

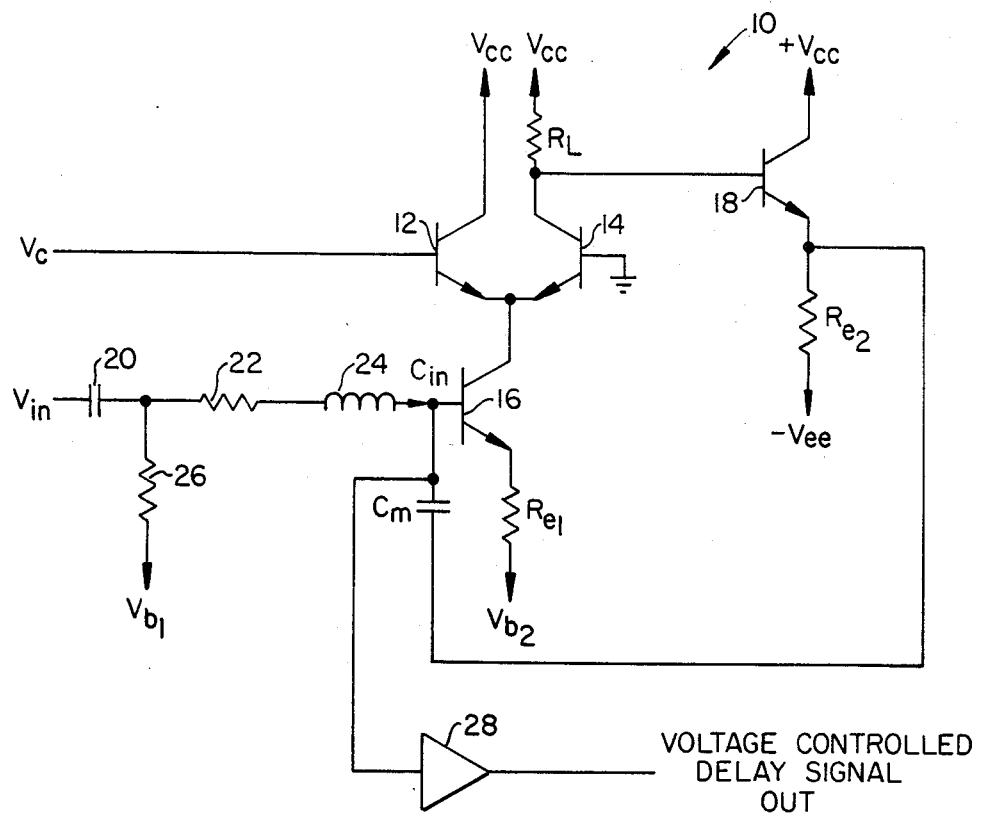

VOLTAGE CONTROLLED VARIABLE CAPACITOR

DESCRIPTION

1. Technical Field

This invention relates to a variable capacitor and, more particularly, to a voltage control capacitor for use in video analog delay lines, sinusoidal phase shifters, and pulse delay lines.

2. Background Art

In many types of delay lines and phase shifters, it is necessary to be able to verify the value of a capacitance in response to an input control voltage. This is typically done by use of what is known as a varactor diode. Such diodes are insufficient in a number of respects. In the first place, when used in pairs, they must be specifically matched by a performance, thus increasing the cost. Secondly, their voltage versus capacitance response is not necessarily repeatable and consistent from time to time. Thirdly, the varactor is somewhat limited in the magnitude of the control signal input voltage. Fourthly, the relationship between the control voltage and the capacitance produced thereby is not always linear.

DISCLOSURE OF THE INVENTION

The above and other disadvantages of prior art voltage controlled capacitance devices are overcome by the present invention of a voltage controlled capacitor circuit comprising an amplifier, whose gain is voltage controllable, and which has an inverting signal input, and output, and a non-inverting control voltage input. A capacitor is connected between the output and inverting input of the voltage controlled amplifier. In this way, the capacitance between the inverting input of the voltage controlled amplifier and the circuit ground is substantially linearly controlled in response to changes in the voltage control input signal.

In a preferred embodiment of the invention, a second amplifier, having an input terminal and an output terminal, is connected at its input terminal to the inverting input terminal of the voltage controlled amplifier. Furthermore, when the invention is used in a signal delay line, the other components of the delay line are connected between a signal input terminal and the inverting input terminal of the voltage controlled amplifier. More specifically, in one embodiment of the invention, the input signal passes through a series connection of a first capacitor, a resistance, and an inductor to reach the inverting input terminal of the voltage controlled amplifier. The voltage at the output of the second amplifier will then be a delayed version of the input signal, with the delay being a linear function of the magnitude of the control voltage supplied to the voltage control input of the first amplifier.

It is therefore an object of the present invention to provide an improved voltage controlled capacitance.

It is yet another object of the present invention to provide a voltage controlled capacitance whose capacitance varies substantially linearly with the magnitude of the control voltage.

It is yet a further object of the present invention to provide a voltage controlled capacitance which, when used in pairs, does not have to be performance matched.

The novel features which are believed to be characteristics of the invention, both as to organization and method of operation, together with further advantages thereof, will be better understood from the following drawings, in which a preferred embodiment of the invention is illustrated by way of example.

BRIEF DESCRIPTION OF THE DRAWING

The FIGURE is a schematic diagram of the voltage controlled capacitor of the invention when used in a delay line circuit.

BEST MODE FOR CARRYING OUT THE INVENTION

Referring now more particularly to the drawing, a voltage controlled amplifier 10 is comprised of NPN transistors 12, 14, 16 and 18. The transistors 12 and 14 each have their emitters connected to the collector of transistor 16. The collector of transistor 12 is connected directly to a voltage bias source ($V_{cc}$). The collector of transistor 14 is connected through a load resistor $R_L$ to the voltage bias source. The base of the transistor 14 is connected to the circuit ground. The base of the transistor 12 is the DC control input to the voltage controlled amplifier 10.

The collector of the transistor 14 is connected to the base input of a fourth NPN transistor 18 whose collector is connected to the voltage bias source and whose emitter is connected through a resistor $R_{e2}$ to a minus voltage source ($-V_{ee}$). A capacitor $C_m$ is connected between the base input of the transistor 16 and the emitter output of the transistor 18.

The emitter output of the transistor 16 is connected through an emitter resistor $R_{e1}$ to a bias voltage ($V_{b2}$).

An input signal $V_{in}$ is supplied through a series connection of a capacitor 20, a resistor 22, and an inductor 24 to the base input of the transistor 16. Another resistor 26 is connected between the junction of the capacitor 20 and the resistor 22 to a bias voltage. In operation, the gain of transistor amplifier 16 is controllable by the magnitude of the voltage $V_c$ since this voltage causes the collector current of transistor 16 to be divided between the transistors 12 and 14 as a function of $V_c$. Usable output in terms of the capacitance is taken between the base terminal of transistor 16 and the circuit ground.

To isolate the circuit from the usable output, a second amplifier 28 has its input connected to the base terminal of the transistor 16. At its output will be a voltage which follows the $V_{in}$, but which is delayed in proportion to the DC control voltage applied to the base terminal of the transistor 12.

A capacitor $C_m$ is connected between the output of the voltage controlled amplifier 10 and the inverting input, at the base input of transistor 16. This forms a Miller multiplier. The Miller multiplier circuit is comprised of the capacitor $C_m$ connected between the output of the voltage controlled amplifier taken at the emitter of the transistor 18 and the inverting input terminal at the base electrode of the transistor 16. The capacitance seen by the inductor 24 is:

$$C_{in} = C_m \left[ \left[ \frac{g_{m1}R_L}{g_{m1}R_{e1} + 1} \right] \frac{1}{1 + e^{V_c/KT/q}} + 1 \right]$$

where
$R_L$ = collector load resistance
$R_{e1}$ = first emitter resistance
$V_c$ = control signal voltage -continued $$g_{m1} = \frac{I_{c1}}{0.026\,v}$$

$I_{c1}$ = standing current of collector of third transistor 16.
$K$ = Boltzman's constant
$T$ = temperature in degrees Kelvin
$q$ = unit of electric charge = $1.6 \times 10^{-19}$ For $R_L/R_{e1} \gg 1$ and $V_c < 20$ mv., the control action is very linear and large changes in $C_{in}$ can be made.

This device, as used in the delay line circuit as shown, eliminates many problems that are experienced using varactor diodes. First, it eliminates matching because the voltage controlled capacitor in principal is repeatable and is consistent in its voltage versus capacitance characteristics. Secondly, the voltage control capacitor of the invention is capable of larger control signal inputs and lower distortion than similar varactor diode circuits. The third advantage is that the linearity of the control voltage versus the capacitance is much better than with varactor diodes.

The terms and expression which have been employed here are used as terms of description and not of limitation and there is no intention, in the use of such terms and expressions, of excluding equivalents of the features shown and described, or portions thereof, it being recognized that various modifications are possible within the scope of the invention as claimed.

I claim:

1. A voltage controlled capacitor circuit comprising an amplifier whose gain is voltage controllable and which has a circuit ground, an inverting signal, first input terminal, a first output terminal and a non-inverting control voltage input terminal and a capacitor connected between the first output terminal and the inverting, first input terminal of the voltage controlled amplifier, whereby the capacitance measured between the inverting, first input terminal of the amplifier and the circuit ground is variable as a function of control voltage applied to the control voltage input terminal.

2. A circuit as recited in claim 1 further comprising a second, isolation amplifier having a second output terminal and a second input terminal, which second input terminal is connected to the first input terminal of the amplifier whose gain is voltage controllable.

3. A circuit as recited in claim 1 further comprising a third input terminal and a second capacitor, a resistor, and a coil all connected in series between the first input terminal of the amplifier whose gain is voltage controllable and the third input terminal.

4. A circuit as recited in claim 1 wherein the voltage controlled amplifier comprises a circuit ground, four transistors of like conductivity type, resistances $R_{e1}$, $R_L$, a capacitor $C_m$ and a plurality of voltage biasing means, and wherein the collector of the first transistor is connected to a first voltage biasing means, the collector of the second transistor is connected through the resistance $R_L$ to the first voltage biasing means, the emitters of the first and second transistors are connected to the collector of the third transistor, the emitter of the third transistor is connected through the resistance $R_{e1}$ to a second voltage biasing means, the base input of the first transistor is the control voltage imput terminal, the base input of the second transistor is connected to the circuit ground, the collector of the second transistor is connected to the base input of the fourth transistor, the collector of the fourth transistor is connected to the first voltage biasing means, the emitter of the fourth transistor is connected to a third voltage biasing means, and the capacitor $C_m$ is connected between the emitter of the fourth transistor and the base of the third transistor.

5. A voltage controlled capacitor circuit comprising an amplifier whose gain is voltage controllable and which has a circuit ground, an inverting signal input, an output and a non-inverting control voltage input input and a capacitor connected between the output and the inverting input of the amplifier whose gain is voltage controllable, wherein the capacitance between the base input of the third transistor and the circuit ground is defined as $C_{in}$ where $$C_{in} = C_m \left[ \left[ \frac{g_{m1} R_L}{g_{m1} R_{e1} + 1} \right] \frac{1}{1 + e^{V_c/KT/q}} + 1 \right]$$

where
$R_L$ = resistance of resistor $R_L$
$R_{e1}$ = resistance of resistor $R_{e1}$
$V_c$ = control signal voltage $$g_{m1} = \frac{I_{c1}}{0.026\,v}$$

$I_{c1}$ = standing current of collector of third transistor
$K$ = Boltzman's constant
$T$ = temperature in degrees Kelvin
$q$ = unit of electric charge = $1.6 \times 10^{-19}$ 6. A circuit as recited in claim 5 wherein for $R_L/R_{e1} \gg 1$ and $V_c < 20$ mv., the control action is very linear and large changes in $C_{in}$ can be made.

* * * * *